United States Patent [19]
Omura

[11] Patent Number: 6,069,749
[45] Date of Patent: May 30, 2000

[54] CATADIOPTRIC REDUCTION OPTICAL SYSTEM

[75] Inventor: Yasuhiro Omura, Tokyo, Japan

[73] Assignee: Nikon Corporation, Tokyo, Japan

[21] Appl. No.: 09/152,532

[22] Filed: Sep. 14, 1998

[30]     Foreign Application Priority Data

Sep. 12, 1997 [JP] Japan ................................. 9-267941

[51] Int. Cl.[7] .................................................. G02B 17/00
[52] U.S. Cl. ........................... 359/727; 359/730; 359/732
[58] Field of Search .................................. 359/727, 730, 359/732–736, 364, 649–650; 355/43, 45, 49, 51, 53

[56]              References Cited

U.S. PATENT DOCUMENTS

| | | | |
|---|---|---|---|
| 4,953,960 | 9/1990 | Williamson | 350/442 |
| 5,220,454 | 6/1993 | Ichihara et al. | 359/487 |
| 5,289,312 | 2/1994 | Hashimoto et al. | 359/487 |
| 5,694,241 | 12/1997 | Ishiyama et al. | 359/727 |
| 5,715,084 | 2/1998 | Takahashi et al. | 359/487 |
| 5,742,436 | 4/1998 | Furter | 359/727 |
| 5,861,997 | 1/1999 | Takahashi | 359/727 |

FOREIGN PATENT DOCUMENTS 2112828   1/1994   Canada ......................... G02B 17/08

Primary Examiner—Georgia Epps
Assistant Examiner—Jordan M. Schwartz
Attorney, Agent, or Firm—Oliff & Berridge, PLC

[57]                ABSTRACT

A catadioptric reduction optical system capable of imaging an object by scanning in a scanning direction. The system comprises, objectwise to imagewise, a first optical system, a beam splitter, and a second optical system arranged adjacent the beam splitter opposite the image side thereof. The second optical system includes at least one concave mirror. The system also includes a third optical system arranged adjacent said beam splitter imagewise thereof, an aperture stop, and a fourth optical system having positive refractive power. The third and fourth optical systems include a plurality of lens elements preferably comprising of at least two glass types for facilitating the correction of aberrations. The system is designed such that the beam splitter is of a practical size, while allowing for a suitable working distance on the image side, a large numerical aperture, and sub-quarter micron resolution in the ultraviolet wavelength range.

11 Claims, 5 Drawing Sheets

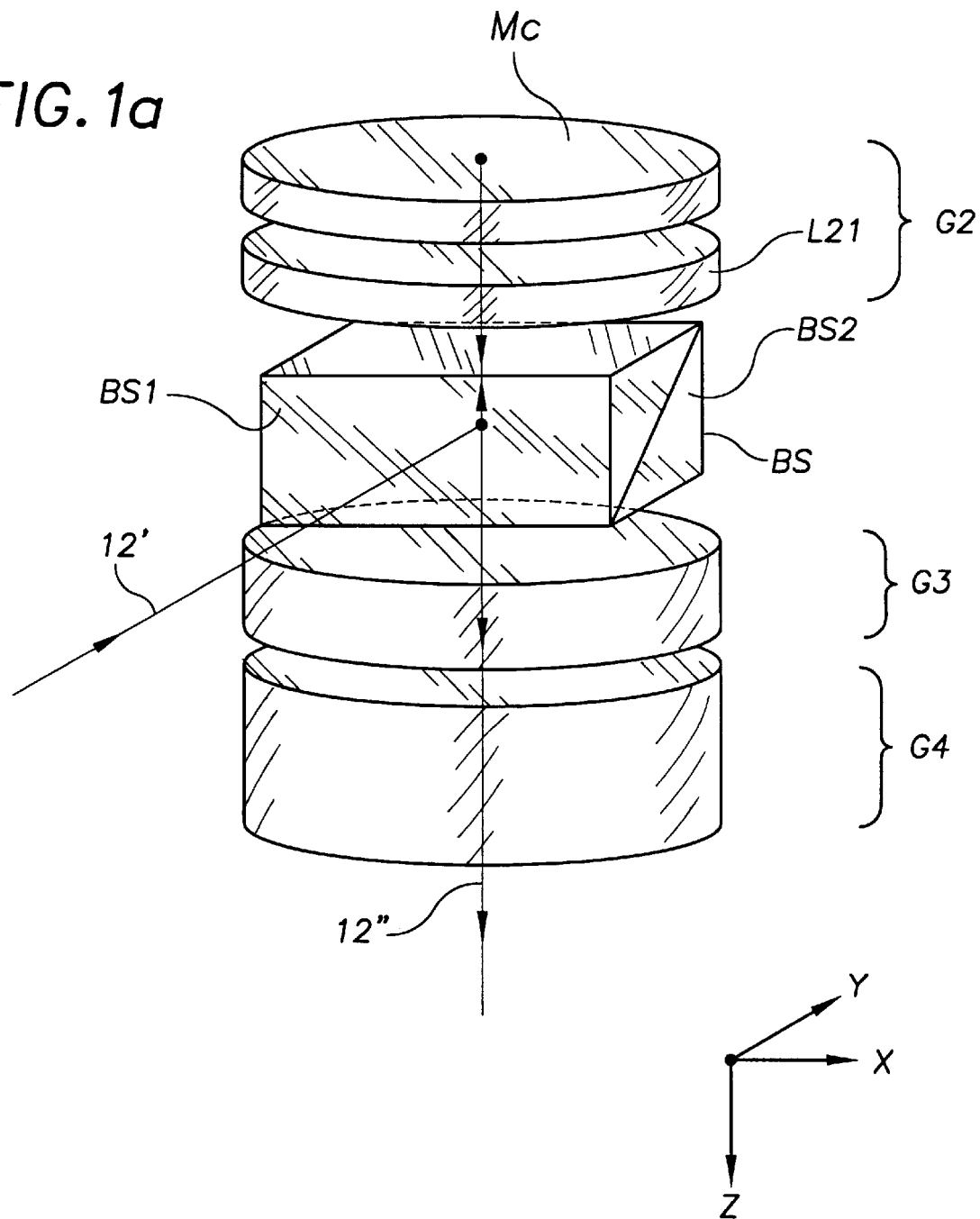

CATADIOPTRIC REDUCTION OPTICAL SYSTEM

FIELD OF THE INVENTION

The present invention relates to an optical system of an exposure apparatus, and in particular to a catadioptric reduction optical system having sub-quarter micron resolution in the ultraviolet wavelength region.

BACKGROUND OF THE INVENTION

In the photolithography process for manufacturing semiconductor devices and the like, an exposure apparatus is used that projects an image of a pattern on a photomask or reticle (hereinafter, reticle) through an optical system (i.e., a projection lens) and onto a wafer or glass plate and the like (hereinafter, wafer) coated with photoresist or the like. In recent years, the size of semiconductor devices have been growing larger, while at the same time the level of integration of these devices has been increasing. Accordingly, scanning-type exposure apparatuses are being developed in order to deal with the increased size and increased level of integration of semiconductor devices.

Along with the increased level of integration of semiconductor devices, there is also an increasing demand for more resolving power from the optical system. To satisfy this demand, it has become necessary to shorten the wavelength of the illumination light and to increase the numerical aperture (NA) of the optical system.

When the wavelength of the illumination light is shortened down to the ultraviolet, only limited types of glass materials are fit for use, depending on the absorption of the light. For wavelengths under 300 nm, only synthetic quartz glass (hereinafter, "quartz") and fluorite can presently be used for the glass material. Since the Abbe numbers of these glass types are not sufficiently different, it is difficult, in cases wherein the wavelength is less than 300 nm, to correct the various aberrations. This particularly true for chromatic aberration when the optical system comprises only refractive components (i.e., is dioptric).

On the other hand, since reflective systems have no chromatic aberration, various catadioptric optical system designs (i.e., designs that combine both reflective and refractive elements have been proposed. For example, Japanese Patent Application Kokoku No. Hei 7-117648, Japanese Patent Application Kokai No. Hei 6-300973, Japanese Patent Application Kokai No. Hei 5-88089, Japanese Patent Application Kokai No. Hei 3-282527, and PCT/EP95/01719 disclose catadioptric reduction optical systems, which include a beam splitter for diverting the optical path to input a light beam from and output a light beam to a reflective system.

In conventional catadioptric optical systems employing a beam splitter, such as those cited above, it is necessary that the beam splitter have a transmission-reflection surface to split the optical path, and to make the beam splitter prism-shaped to avoid generating asymmetric aberration. Nevertheless, the larger the prism-type beam splitter, the greater the risk that the resolving power will deteriorate due to the non-uniformity of the material comprising the prism.

Japanese Patent Application Kokai No. Hei 3-282527 discloses a catadioptric optical system which uses a polarizing beam splitter designed to prevent a loss in the quantity of light or the generation of stray light due to flaring and the like. However, a transmission-reflection film having a multilayer construction that transmits "p" polarized light and reflects "s" polarized light is needed on the transmission-reflection surface of the polarizing beam splitter. In addition, a ¼-wave plate is essential to change the polarization state. As the optical elements like the polarizing beam splitter and the ¼-wave plate become larger, manufacturing becomes extremely difficult, and the manufacturing costs required to achieve sub-quarter-micron resolving power become extremely large.

SUMMARY OF THE INVENTION

The present invention relates to an optical system of an exposure apparatus, and in particular to a catadioptric reduction optical system having sub-quarter micron resolution in the ultraviolet wavelength region. Such systems are used in the manufacturing of semiconductor devices or liquid crystal display devices using photolithography processes. Among the goals of the present invention is to address the aforementioned shortcomings in conventional optical systems and provide a catadioptric reduction optical system for a scanning-type exposure apparatus having a) a prism-type beam splitter for splitting the optical path that is of a practical size while achieving a large numerical aperture in the ultraviolet wavelength region, b) a suitable working distance on the image side, and c) at least quarter-micron resolution.

Thus, a first aspect of the invention is a catadioptric reduction optical system capable of imaging an object by scanning in a particular direction. The system comprises, objectwise to imagewise, a first optical system and a beam splitter. The beam splitter has a beam splitting surface with an incident plane (or plane of incidence), and the beam splitter is arranged so that said incident plane includes the scanning direction.

The system further includes a second optical system arranged adjacent the beam splitter, opposite the image side thereof, in a reflection optical path and a transmission optical path. The second optical system includes at least one concave mirror. On the opposite side of the beam splitter (i.e., the image side) is included a third optical system in the reflection optical path and the transmission optical path, and aperture stop, and a fourth optical system. The third optical system includes at least one negative lens and at least one positive lens. The fourth optical system has positive refractive power.

A second aspect of the invention is a catadioptric reduction optical system as described above, wherein the system is doubly telecentric. Further, the fourth optical system has a front focal plane and the aperture stop is arranged at or near this front focal plane.

A third aspect of the invention is a catadioptric reduction optical system as described above, wherein the third lens group comprises a first plurality of optical elements, comprised of two or more glass materials. Likewise, the fourth lens group comprises a second plurality of optical elements, comprised of two or more glass materials. Two preferred glass materials are quartz and fluorite. Such an arrangement facilitates the correction of aberrations.

BRIEF DESCRIPTION OF THE DRAWINGS

FIG. 1a is a schematic perspective view of a portion of the present invention with one version of a beam splitter;

DETAILED DESCRIPTION OF THE INVENTION

The present invention relates to an optical system of an exposure apparatus, and in particular to a catadioptric reduction optical system having sub-quarter micron resolution in the ultraviolet wavelength region. Such systems are used in the manufacturing of semiconductor devices or liquid crystal display devices fabricated using photolithographic processes. Among the goals of the present invention is to address the aforementioned shortcomings in conventional optical systems and to provide a catadioptric reduction optical system for a scanning-type exposure apparatus having a) a prism-type beam splitter, for splitting the optical path, that is of a practical size while at the same time achieving a large numerical aperture in the ultraviolet wavelength region, b) a suitable working distance on the image side, and c) at least quarter-micron resolution.

Figure 1:
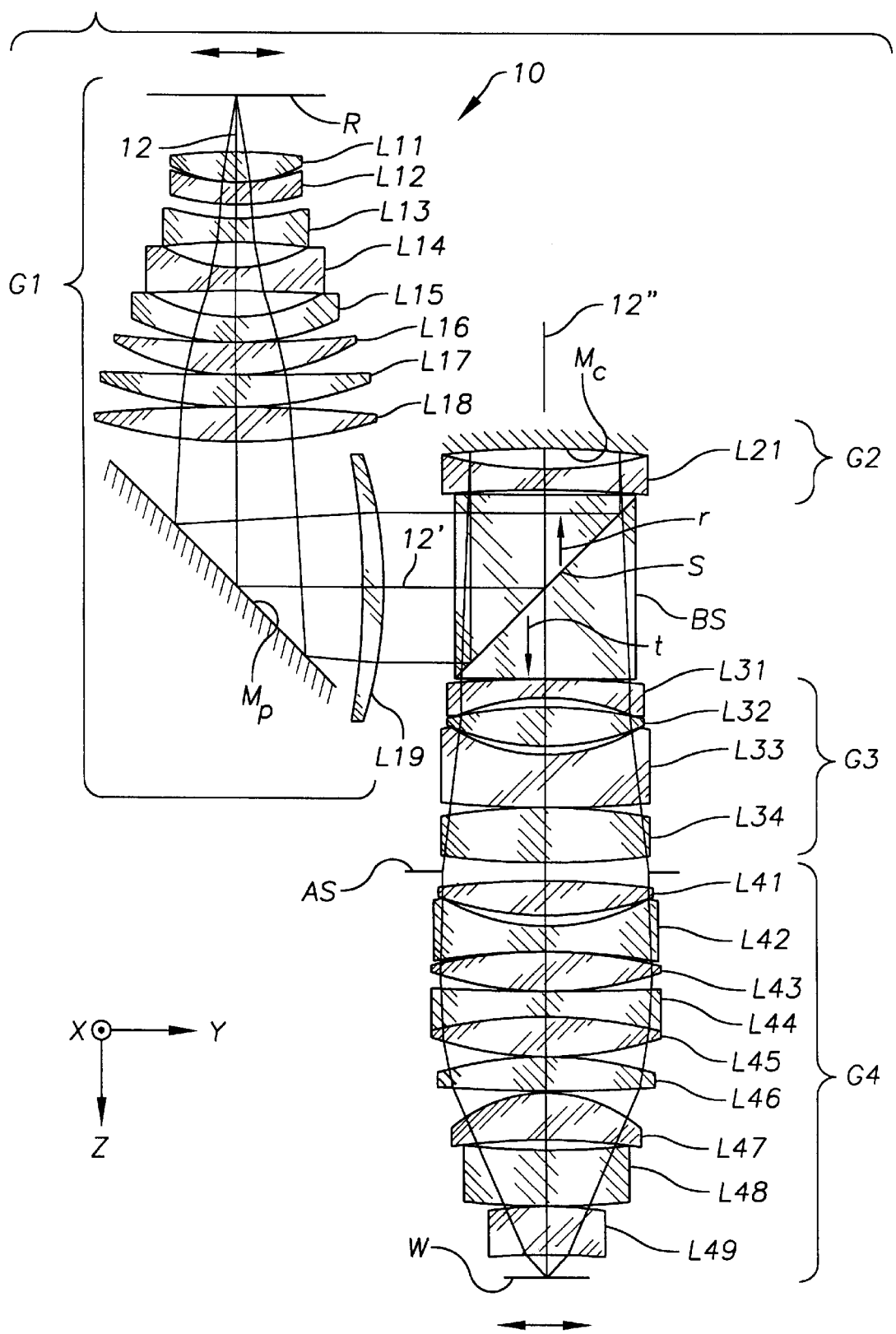
FIG. 1. is an optical sectional diagram of Working Example 1 of the catadioptric reduction optical system according to the present invention.
Figure 2A:
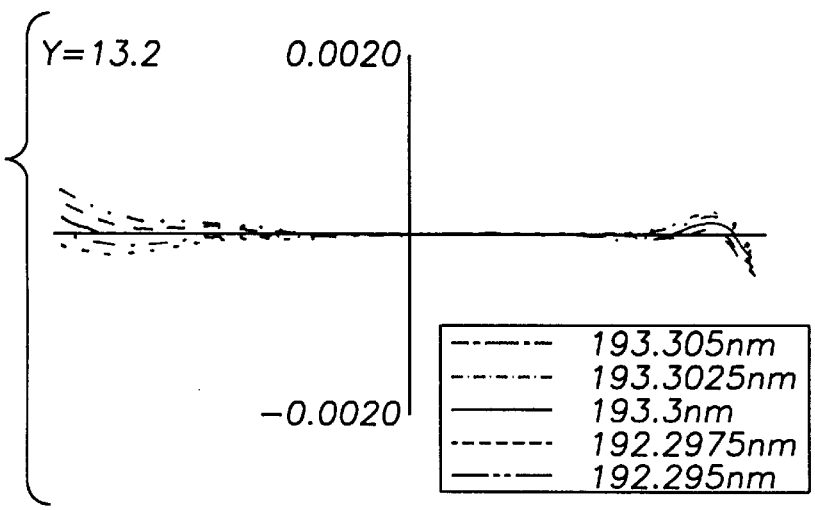
FIG. 2a shows lateral aberration plots for Working Example 1 at various wavelengths for an image of a first height.
Figure 2B:
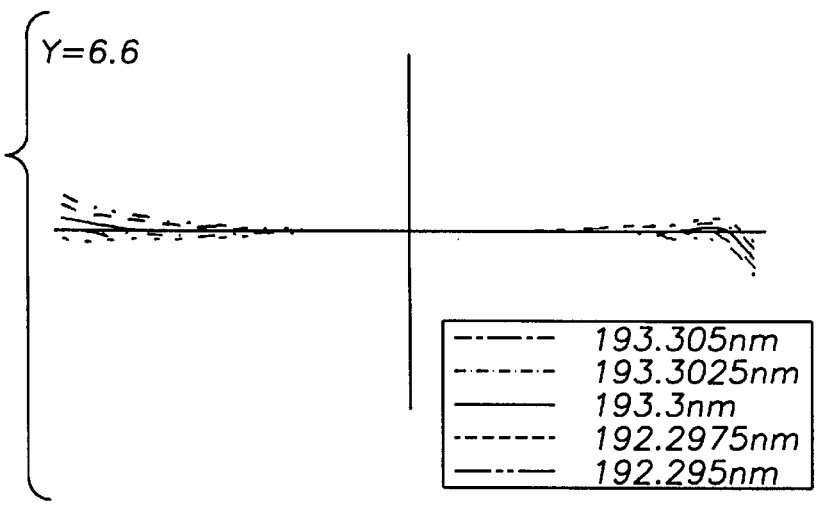
FIG. 2b shows lateral aberration plots for Working Example 1 at various wavelengths for an image of a second height.
Figure 2C:
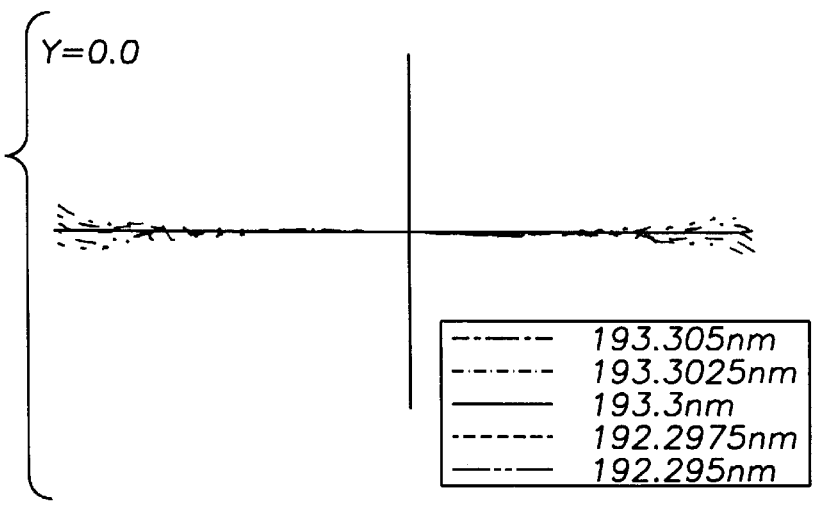
FIG. 2c shows lateral aberration plots for Working Example 1 at various wavelengths without an image.
Figure 3:
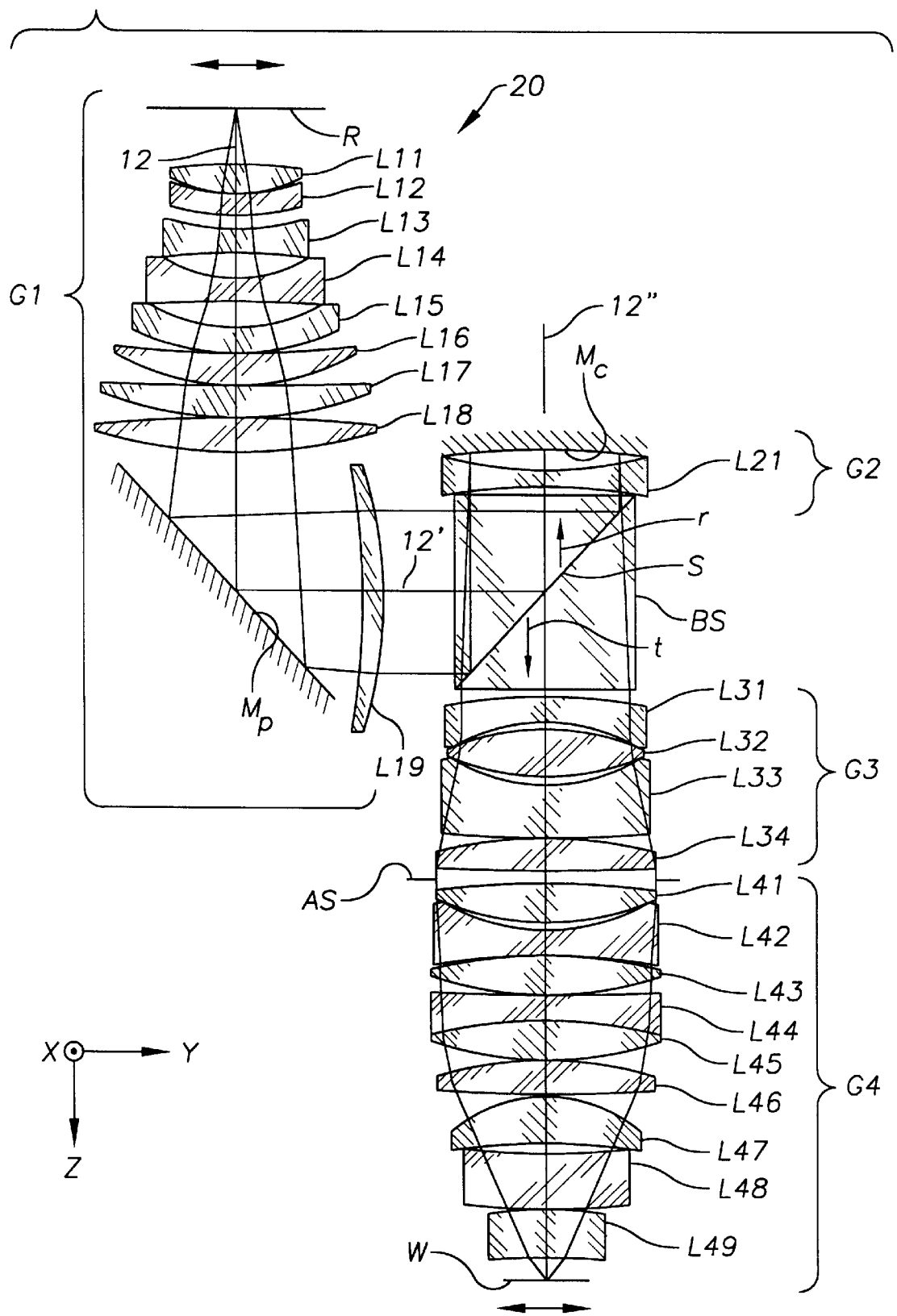
FIG. 3 is an optical sectional diagram of Working Example 2 of the catadioptric reduction optical system according to the present invention.
Figure 4A:
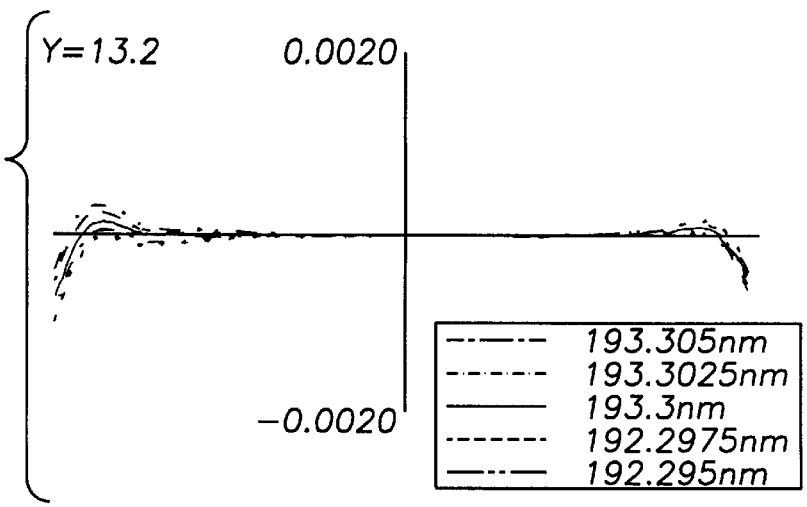
FIG. 4a shows lateral aberration plots for Working Example 2 at various wavelengths for an image of a first height.
Figure 4B:
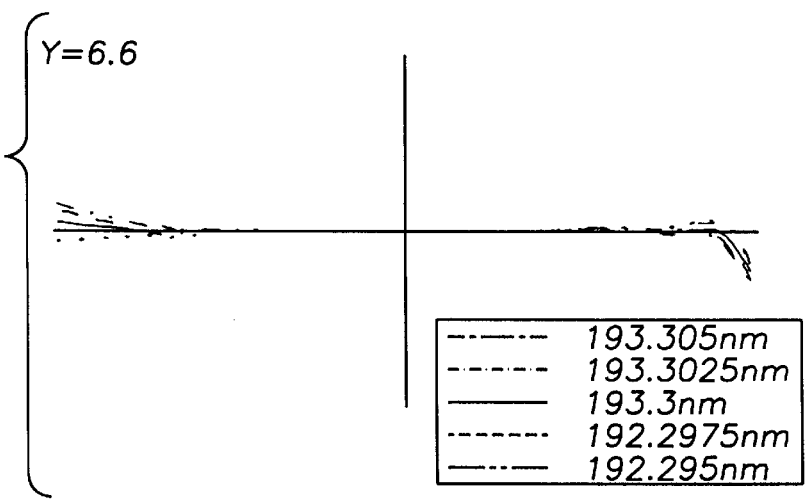
FIG. 4b shows lateral aberration plots for Working Example 2 at various wavelengths for an image of a second height.
Figure 4C:
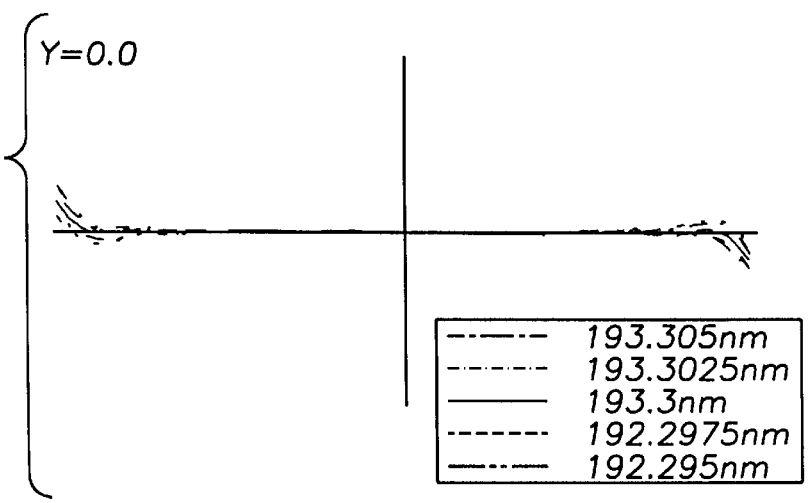
FIG. 4c shows lateral aberration plots for Working Example 2 at various wavelengths without an image.

FIGS. 1 and 3 show catadioptric reduction optical systems 10 and 20 corresponding to Working Examples 1 and 2 of the present invention. For the sake of reference, the general catadioptric reduction optical system of the present invention is described with reference to catadioptric reduction optical system 10 of FIG. 1. Also, the "scanning" direction is the ±y-direction and the "cross-scanning" direction is the ±x-direction. Also, "objectwise" means "toward reticle R" and "imagewise" means "towards wafer W."

To meet the goals of the present invention, catadioptric reduction optical system 10 reduces the image of one part of a pattern (not shown) on a first surface (e.g., a reticle R) and forms an image on a second surface (e.g, a wafer W). By synchronously scanning reticle R and wafer W at a speed ratio corresponding to the reduction magnification, system 10 forms on wafer W an image of the pattern greater than the one part to the extent enlarged in the scanning direction. In other words, a static (i.e., non-scanned) exposure by system 10 would only image a portion (i.e., a slit-shaped projection area) of the pattern on reticle R onto wafer W. However, by performing a dynamic (i.e., scanned) exposure, substantially the entire pattern on reticle R is imaged onto wafer W.

With reference to FIG. 1, system 10 comprises, in order from reticle R along axis 12, a first optical system G1 and a beam splitter BS arranged such that the incident plane of the splitting surface S includes the scanning direction. A reflection optical path r is reflected from surface S of beam splitter BS, and a transmission optical path t is transmitted through surface S of the beam splitter, as shown.

System 10 further includes a second optical system G2 arranged in the reflection optical path r and transmission optical path t of the light beam impinging on beam splitter BS and that includes at least one concave mirror $M_C$. System 10 also includes a third optical system G3 arranged imagewise of optical system G2 and arranged in transmission optical path t and reflection optical path r of the light beam that returns from second optical system G2 to beam splitter BS. Optical system G3 includes at least one negative lens and at least one positive lens, and an aperture stop AS. System 10 also includes a fourth optical system G4 having positive refractive power and arranged imagewise of optical system G3.

The effective diameter D of an image-forming optical system, such as optical system 10, requires an effective diameter which corresponds to the numerical aperture NA in the vicinity of aperture stop AS. However, as the object plane (i.e., first surface or reticle R) is approached from aperture stop AS, an effective diameter $D_1$ suited to the object-side numerical aperture $NA_1$, as well as to the object height H, is needed. In other words:

$$D_1 = D_1(NA_1, H).$$

Likewise, as the image plane (i.e., second surface or wafer W) is approached from aperture stop AS, an effective diameter $D_2$ suited to image-side numerical aperture $NA_2$, as well as to image height Y, is needed. In other words:

$$D_2 = D_2(NA_2, Y).$$

On the other hand, to ensure a wide exposure area when scanning the object plane (reticle R) and image plane (wafer W) relative to a slit-shaped projection area that includes optical axis 12, it is necessary to adequately account for object height $H_x$ and image height $Y_x$ in the cross-scanning direction. As a result, object height $H_y$ and image height $Y_y$ in the scanning direction becomes sufficiently small compared to effective diameters $D_{1y}$ and $D_{2y}$ in the scanning direction. Accordingly, it is sufficient if just effective diameters $D_{1y}$ and $D_{2y}$ largely suited to the object-side numerical aperture $NA_1$ and image-side numerical aperture $NA_2$ in the scanning direction are ensured. In other words:

$$D_{1y} \approx D_{1y}(NA_1),\ D_{2y} \approx D_{2y}(NA_2). \tag{1}$$

In the cross-scanning direction, objectwise of aperture stop AS, an effective diameter $D_{1x}$ suited to both object height $H_x$ in the x-direction and object-side numerical aperture $NA_1$ is necessary. Likewise, imagewise of aperture stop AS, an effective diameter $D_{2x}$ suited to both image height $Y_x$ in the x-direction and image-side numerical aperture $NA_2$ is necessary. Therefore:

$$D_{1x} = D_{1x}(NA_1, H_x),\ D_{2x} = D_{2x}(NA_2, Y_x). \tag{2}$$

In other words, effective diameters $D_{1x}$ and $D_{2x}$ in the cross-scanning direction are larger than effective diameters $D_{1y}$ and $D_{2y}$ in the scanning direction. Thus:

$$D_{1y} < D_{1x},\ D_{2y} < D_{2x}. \tag{3}$$

On the other hand, since lenses L11–L49 and concave mirror $M_C$ comprising system 10 are manufactured to be circular in shape, the larger effective diameters, namely effective diameters $D_{1x}$ and $D_{2x}$, determine the effective diameters of the lenses and concave mirror of optical system 10.

Nevertheless, because the effective diameters are not equal, it is not necessary to form prism-type beam splitter BS in a cube shape. Accordingly, if the incident plane (not shown) of the splitting surface (i.e., the plane defined by incident optical axis 12' and reflection optical axis 12") is arranged so that it includes the scanning direction, the length of beam splitter BS must be made long, so that expression (2) is satisfied in the cross-scan direction orthogonal to the incident plane. Nevertheless, it is sufficient if the effective diameter in the incident plane satisfies only expression (1). Thus, a compact beam splitter BS can be achieved.

Furthermore, as mentioned previously, it is sufficient if just effective diameters $D_{1y}$ and $D_{2y}$ largely suited to object-side numerical aperture $NA_1$ and image-side numerical aperture $NA_2$ in the scanning direction are ensured. However, when the object-side numerical aperture $NA_1$ in a reduction optical system is smaller than the image-side numerical aperture $NA_2$, the following inequality results:

$$D_{1y} < D_{2y} \qquad (4)$$

With continuing reference to system 10 of FIG. 1, in the present invention, beam splitter BS is arranged objectwise of aperture stop AS, allowing for a compact beam splitter BS. Furthermore, in the present invention, third optical system G3 is arranged between beam splitter BS and aperture stop AS, and is constituted such that the light beam diameter is reduced in the direction from aperture stop AS to beam splitter BS. Therefore, a further reduction in the size of beam splitter BS can be achieved.

Based on the preceding analysis, FIG. 1a provides a perspective schematic view of one version of the beam splitter BS according to the present invention. FIG. 1a depicts most of the components of the invention, with the exception of lens system G1. As depicted in FIG. 1a, the image, in the form of a slit, projected from the object position, not shown, by the system along axis 12' enters the beam splitter BS at surface BS1 of the beam splitter. It is then diverted toward mirror Mc which in turn reflects it back along axis 12" toward the image or wafer position, not show. As noted previously, the scanning direction is in the y-direction and the slit projected will run in the x-direction which is cross ways or perpendicular to the y-direction. And as derived above, since the slit or the object height $H_y$ and the image height $Y_y$ in the y-direction are sufficiently small, note equation (1) above, the dimensional size of the beam splitter BS is substantially smaller in the y-direction. On the other hand, the object height $H_x$ and the image height $Y_x$ according to equation (2) above are at full size making the beam splitter much longer in the x-direction. Thus, in FIG. 1a the beam splitter BS takes the form of a rectangular parallelepiped; however, other shapes which meet the previously described criteria are possible.

In a preferred embodiment of the present invention, it is preferable to use a polarizing beam splitter as beam splitter BS to make effective use of the light. In this case, a ¼-wave plate (not shown) is arranged in the optical path (intermediate optical path) of the light beam that returns to the polarizing beam splitter after it is emitted from polarizing beam splitter BS (e.g., between beam splitter BS and mirror $M_C$).

When using a polarizing beam splitter, the light beam emitted therefrom is linearly polarized. However, depending on the orientation of the pattern on reticle R to be imaged, it may be preferable to form an image on wafer W with circularly polarized light. In this case, a ¼-wave plate is arranged in the optical path downstream (i.e., image-wise) of the polarizing beam splitter. This will convert the linearly polarized light to circularly polarized light.

In this case as well, since the light beam diameter in the scanning direction is sufficiently small, compactness of the ¼-wave plate can be achieved. However, the ¼-wave plate can also be arranged in the vicinity of wafer W.

It is also preferable in the present invention that system 10 be telecentric both on the reticle R side and the wafer W side (i.e., doubly telecentric). Consequently, image distortion due to displacement along optical axis 12, such as by flexure of reticle R, wafer W, and the like can be accommodated.

In addition, it is preferable that aperture stop AS be arranged in the vicinity of the front focal plane of fourth optical system G4. This allows the coherence factor (i.e., a value) to be adjusted equally over the entire exposure area.

In addition, in the present invention, it is preferable that the lenses comprising third optical system G3 comprise two or more glass materials, and that the lenses comprising fourth optical system G4 also comprise two or more glass materials. This allows chromatic aberration to be satisfactorily corrected.

When the light used for projection exposure is laser light having a wavelength under 300 nm, chromatic aberration is corrected by a combination of fluorite and quartz. However, the focal length of fluorite lenses changes greatly with the heat from irradiation. Accordingly, it is preferable to make the configuration such that the lenses comprising third optical system G3 include at least one positive lens comprising fluorite and a negative lens comprising quartz. Further, it is preferable that the lenses comprising fourth optical system G4 include at least one positive lens comprising fluorite. Consequently, chromatic aberration can be favorably corrected while reducing fluctuations in the magnification of system 10 due to irradiation.

To satisfactorily correct the various aberrations, it is preferable to arrange the quartz negative lens and positive flourite lens in third optical system G3 objectwise to image-wise.

In addition, it is preferable in the present invention to provide at least one biconcave lens (e.g., lens L21) in addition to the concave mirror $M_C$ in second optical system G2. This allows the Petzval sum to approach 0, and the field curvature to be satisfactorily corrected.

It is also preferable to arrange biconcave lens L21 such that the surface having the stronger negative refractive power faces concave mirror $M_C$. This allows for coma, astigmatism and distortion to be satisfactorily corrected.

Furthermore, if it is desired to arranged the first surface (reticle R) and second surface (wafer W) to be parallel, this can be easily achieved by using a fold mirror, such as plane mirror $M_P$, in the optical path of first optical system G1.

WORKING EXAMPLES

FIG. 1 shows system 10 of Working Example 1 and FIG. 3 shows system 20 of Working Example 2 of the catadioptric reduction optical system according to the present invention. Both Working Examples are designed for scanning-type exposure apparatus. That is, they are designed such that they reduce the image of one part of the pattern on reticle R, form an image on wafer W and, by synchronously scanning reticle R and wafer W at a speed ratio corresponding to the reduction magnification of the optical system, form an image on wafer W of the pattern to the extent magnified in the scanning direction.

Furthermore, the scanning direction is in the paper plane of FIG. 1 and FIG. 3, as indicated by the double arrows. The main difference between Working Examples 1 and 2 is that Working Example 1 has an NA=0.65, whereas Working Example 2 has an NA=0.7.

Both systems 10 and 20 of Working Examples 1 and 2, respectively, comprise, in order from reticle R, first optical system $G_1$ and beam splitter BS. Systems 10 and 20 further include second optical system $G_2$ arranged in the reflection optical path R of the light beam that impinges on the beam splitter. Systems 10 and 20 further include a third optical system $G_3$ arranged in the transmission optical path T of the light beam that returns from second optical system $G_2$ to the beam splitter, aperture stop AS, and fourth optical system $G_4$ having a positive refractive power.

First optical system $G_1$ comprises biconvex lens $L_{11}$, meniscus lens $L_{12}$ having an imagewise convex surface, two biconcave lenses $L_{13}$ and $L_{14}$, three meniscus lenses $L_{15}$, $L_{16}$ and $L_{17}$ having imagewise convex surfaces, and a meniscus lens $L_{19}$ having an imagewise convex surface. Lenses $L_{11}$ to $L_{19}$ are comprised of quartz. In addition, fold mirror $M_P$, which bends the optical path 90°, is arranged between lens $L_{18}$ and lens $L_{19}$.

Beam splitter BS is comprised of quartz, and the incident plane (not shown) of the splitting surfaces (i.e., the plane that includes incident optical axis 12' and reflection optical axis 12") is arranged so that it includes the scanning direction of reticle R and wafer W, depicted by the double arrows.

Second optical system $G_2$ comprises a biconcave lens $L_{21}$ concave mirror $M_C$. Biconcave lens $L_{21}$ is comprised of quartz and is arranged so that the surface having the stronger negative refractive power faces concave mirror $M_C$.

Third optical system $G_3$ comprises a meniscus negative lens $L_{31}$ having an objectwise convex surface, a biconvex lens $L_{32}$, a meniscus negative lens $L_{33}$ having an imagewise convex surface, and a biconvex lens $L_{34}$. Among these, biconvex lens $L_{32}$ is comprised of fluorite, and the two meniscus negative lenses $L_{31}$ and $L_{33}$ and biconvex lens $L_{34}$ are comprised of quartz.

Fourth optical system $G_4$ comprises a biconvex lens $L_{41}$, a biconcave lens $L_{42}$, a biconvex lens $L_{43}$, a biconcave lens $L_{44}$, two biconvex lenses $L_{45}$ and $L_{46}$, a meniscus positive lens $L_{47}$ having an objectwise convex surface, a meniscus lens $L_{48}$ having an imagewise convex surface, and a meniscus lens $L_{49}$ having an objectwise convex surface. Among these, the four biconvex lenses $L_{41}$, $L_{43}$, $L_{45}$ and $L_{46}$ and meniscus positive lens $L_{47}$ are comprised of fluorite, and the other four lenses $L_{42}$, $L_{44}$, $L_{48}$ and $L_{49}$ are comprised of quartz.

Tables 1 and 2 below list the design specifications for Working Examples 1 and 2. In the Tables, "S" in the first column indicates the number of each optical surface from the reticle R side, "r" in the second column indicates the radius of curvature of each optical surface, "d" in the third column indicates the axial spacing between adjacent optical surfaces, and "Glass-type" in the fourth column indicates the glass-type (which is air where no glass type is indicated) for the particular optical "Element" listed in the fifth column. Radius of curvature r and on-axis spacing d are positive in the direction that the light travels, but the sign is reversed each time the light is reflected.

TABLE 1

DESIGN SPECIFICATIONS

| | |
|---|---|
| NA (image side) | 0.65 |
| Exposure Area (slit size) | 25 × 8 |
| Exposure Wavelength | 193.3 nm ± 5 pm |
| Refractive Index (Quartz) | 1.56033 |
| Refractive Index (Flourite) | 1.50146 |
| Entrance Pupil Position | ∞ |
| Exit Pupil Position | ∞ |

| S | r | d | Glass-Type | Element |
|---|---|---|---|---|
| 0 | ∞ | 53.765 | | R |
| 1 | 452.7156 | 27.740 | Quartz | $L_{11}$ |
| 2 | −141.7872 | 0.500 | | |
| 3 | −151.0406 | 20.000 | Quartz | $L_{12}$ |
| 4 | −245.8530 | 12.008 | | |
| 5 | −177.2110 | 20.000 | Quartz | $L_{13}$ |
| 6 | 367.7376 | 25.097 | | |
| 7 | −131.6120 | 20.000 | Quartz | $L_{14}$ |
| 8 | 1314.8380 | 26.715 | | |
| 9 | −159.9926 | 20.002 | Quartz | $L_{15}$ |
| 10 | −203.1269 | 1.495 | | |
| 11 | −839.6396 | 29.218 | Quartz | $L_{16}$ |
| 12 | −230.1293 | 0.580 | | |
| 13 | −13522.5101 | 32.564 | Quartz | $L_{17}$ |
| 14 | −317.7889 | 0.500 | | |
| 15 | 1253.7297 | 32.067 | Quartz | $L_{18}$ |
| 16 | −495.1945 | 130.000 | | |
| 17 | ∞ | −120.000 | Mirror | $M_P$ |
| 18 | 559.1748 | −20.000 | Quartz | $L_{19}$ |
| 19 | 363.9048 | −70.000 | | |
| 20 | ∞ | −85.000 | | |
| 21 | ∞ | 85.000 | Quartz | BS (Reflection) |
| 22 | ∞ | 3.500 | | |
| 23 | −2201.1136 | 20.000 | Quartz | $L_{21}$ |
| 24 | 353.4924 | 21.257 | | |
| 25 | −675.8569 | −21.257 | Mirror | $M_C$ |
| 26 | 353.4924 | −20.000 | Quartz | $L_{21}$ |
| 27 | −2201.1136 | −3.500 | | |
| 28 | ∞ | −85.000 | | |
| 29 | ∞ | −85.000 | Quartz | BS (Transmission) |
| 30 | ∞ | −0.500 | | |
| 31 | −1162.8281 | −20.000 | Quartz | $L_{31}$ |
| 32 | −221.5658 | −11.010 | | |
| 33 | −371.6982 | −38.075 | Flourite | $L_{32}$ |
| 34 | 220.2687 | −6.077 | | |
| 35 | 180.8486 | −50.000 | Quartz | $L_{33}$ |
| 36 | 1209.7202 | −0.500 | | |
| 37 | −691.0671 | −50.000 | Quartz | $L_{34}$ |
| 38 | 982.7157 | −10.000 | | |
| 39 | – | −10.000 | Aperture Stop | AS |
| 40 | −808.9152 | −31.672 | Flourite | $L_{41}$ |
| 41 | 286.8298 | −8.572 | | |
| 42 | 210.0000 | −25.000 | Quartz | $L_{42}$ |
| 43 | −731.9759 | 0.500 | | |
| 44 | −553.6404 | −36.275 | Flourite | $L_{43}$ |
| 45 | 325.2309 | −0.500 | | |
| 46 | 2335.0558 | −25.000 | Quartz | $L_{44}$ |
| 47 | −444.2185 | −2.516 | | |
| 48 | −482.8190 | −37.178 | Flourite | $L_{45}$ |
| 49 | 342.2166 | −0.500 | | |
| 50 | −300.0000 | −28.360 | Flourite | $L_{46}$ |
| 51 | 2097.0095 | −0.500 | | |
| 52 | −140.1576 | −46.939 | Flourite | $L_{47}$ |
| 53 | −578.8826 | −9.388 | | |
| 54 | 1142.7162 | −50.000 | Quartz | $L_{48}$ |
| 55 | 2461.6913 | −0.500 | | |
| 56 | −278.7428 | −50.000 | Quartz | $L_{49}$ |
| 57 | −878.9521 | −22.097 | | |
| 58 | ∞ | | | W |

TABLE 2

DESIGN SPECIFICATIONS

| | |
|---|---|
| NA (image side) | 0.7 |
| Exposure Area (slit size) | 25 × 8 |
| Exposure Wavelength | 193.3 nm ± 5 pm |
| Refractive Index (Quartz) | 1.56033 |
| Refractive Index (Flourite) | 1.50146 |

TABLE 2-continued

DESIGN SPECIFICATIONS

| | |
|---|---|
| Entrance Pupil Position | ∞ |
| Exit Pupil Position | ∞ |

| S | r | d | Glass-Type | Element |
|---|---|---|---|---|
| 0 | ∞ | 54.081 | Reticle | R |
| 1 | 398.3485 | 28.311 | Quartz | $L_{11}$ |
| 2 | −152.8815 | 2.063 | | |
| 3 | −173.2030 | 20.000 | Quartz | $L_{12}$ |
| 4 | −326.9423 | 11.213 | | |
| 5 | −170.2973 | 20.000 | Quartz | $L_{13}$ |
| 6 | 362.9306 | 25.513 | | |
| 7 | −138.0061 | 20.000 | Quartz | $L_{14}$ |
| 8 | 1892.0100 | 27.294 | | |
| 9 | −161.4599 | 20.000 | Quartz | $L_{15}$ |
| 10 | −198.3378 | 1.184 | | |
| 11 | −828.9687 | 28.894 | Quartz | $L_{16}$ |
| 12 | −249.2427 | 0.500 | | |
| 13 | −23177.5408 | 35.081 | Quartz | $L_{17}$ |
| 14 | −317.2272 | 0.500 | | |
| 15 | 1512.1115 | 33.664 | Quartz | $L_{18}$ |
| 16 | −483.6264 | 130.000 | | |
| 17 | ∞ | −120.000 | Quartz | $M_p$ |
| 18 | 796.8761 | −20.000 | Quartz | $L_{19}$ |
| 19 | 450.3279 | −70.000 | | |
| 20 | ∞ | −95.000 | | |
| 21 | ∞ | 95.000 | Quartz | BS (Reflection) |
| 22 | ∞ | 7.148 | | |
| 23 | −959.9139 | 20.000 | Quartz | $L_{21}$ |
| 24 | 449.7724 | 23.260 | | |
| 25 | −657.1603 | −23.260 | Mirror | $M_C$ |
| 26 | 449.7724 | −20.000 | Quartz | $L_{21}$ |
| 27 | −959.9139 | −7.148 | | |
| 28 | ∞ | −95.000 | | |
| 29 | ∞ | −95.000 | Quartz | BS (Transmission) |
| 30 | ∞ | −12.646 | | |
| 31 | −554.2348 | −20.000 | Quartz | $L_{31}$ |
| 32 | −210.2061 | −10.431 | | |
| 33 | −309.6006 | −42.056 | Flourite | $L_{32}$ |
| 34 | 273.3497 | −8.063 | | |
| 35 | 205.2258 | −48.157 | Quartz | $L_{33}$ |
| 36 | 2137.1537 | −0.500 | | |
| 37 | −530.1380 | −28.399 | Quartz | $L_{34}$ |
| 38 | 3747.0381 | −10.000 | | |
| 39 | – | −10.000 | Aperture | AS Stop |
| 40 | −1094.8819 | −34.800 | Flourite | $L_{41}$ |
| 41 | 261.4998 | −7.426 | | |
| 42 | 210.0460 | −25.000 | Quartz | $L_{42}$ |
| 43 | −960.1124 | −0.500 | | |
| 44 | −641.9375 | −35.113 | Flourite | $L_{43}$ |
| 45 | 372.0247 | −0.500 | | |
| 46 | 6632.0219 | −25.000 | Quartz | $L_{44}$ |
| 47 | −428.2145 | −0.500 | | |
| 48 | −427.6450 | −41.337 | Flourite | $L_{45}$ |
| 49 | 348.6989 | −0.500 | | |
| 50 | −297.7933 | −29.818 | Flourite | $L_{46}$ |
| 51 | 2122.4873 | −0.500 | | |
| 52 | −133.2424 | −45.800 | Flourite | $L_{47}$ |
| 53 | −638.3334 | −8.952 | | |
| 54 | 1231.5328 | −50.000 | Quartz | $L_{48}$ |
| 55 | 1848.6592 | −0.500 | | |
| 56 | −320.7237 | −50.000 | Quartz | $L_{49}$ |
| 57 | −705.3151 | −15.167 | | |
| 58 | ∞ | | Wafer | W |

In the lateral aberration plots shown in FIGS. 2a, 2b, 2c, 4a, 4b and 4c, Y indicates the image height. As is clear from these plots, both Working Examples 1 and 2 have excellent imaging performance.

The present invention provides a catadioptric reduction optical system that is used as the optical system (i.e., projection lens) of a scanning-type exposure apparatus, wherein the prism-type beam splitter for splitting the optical path is of a practical size, while achieving a large numerical aperture in the ultraviolet wavelength region. The working distance on the image side is sufficiently ensured, and the system is capable of quarter-micron resolution.

While the present invention has been described in connection with preferred embodiments, it will be understood that it is not limited to those embodiments. On the contrary, it is intended to cover all alternatives, modifications and equivalents as may be included within the spirit and scope of the invention as defined in the appended claims.

What is claimed is:

1. A catadioptric reduction optical system capable of imaging an object by scanning in a scanning direction, comprising objectwise to imagewise:

a.) a first optical system;

b.) a beam splitter having a splitting surface with an incident plane, said beam splitter arranged so that said incident plane includes the scanning direction;

c.) a second optical system arranged adjacent said beam splitter, opposite the image side thereof, in a reflection optical path and a transmission optical path, said second optical system including at least one concave mirror;

d.) a third optical system arranged adjacent said beam splitter and imagewise thereof, in said reflection optical path and said transmission optical path, said third optical system including at least one negative lens and at least one positive lens;

e.) an aperture stop;

f.) a fourth optical system having positive refractive power; and wherein said catadioptric reduction optical system has an effective diameter that is larger in a cross-scanning direction than in the scanning direction, and said beam splitter has a non-cubic configuration, as determined along said incident plane, such that said beam splitter has a greater dimension in the cross-scanning direction than in the scanning direction.

2. A catadioptric reduction optical system according to claim 1, wherein:

a) the system is doubly telecentric;

b) said fourth optical system has a front focal plane; and c) said aperture stop is arranged in the vicinity of said front focal plane.

3. A catadioptric reduction optical system according to claim 2, wherein:

a) said third lens system comprises a first plurality of optical elements, comprised of two or more glass materials; and b) said fourth lens system comprises a second plurality of optical elements comprised of two or more glass materials.

4. A catadioptric reduction optical system according to claim 3, wherein said glass materials include quartz and fluorite.

5. A catadioptric reduction optical system according to claim 3, wherein:

a) said third optical system includes at least a positive lens comprising fluorite and a negative lens comprising quartz; and b) said fourth optical system includes at least a positive lens comprising fluorite.

6. A catadioptric reduction optical system according to claim 1, wherein:
   a) said second optical system includes at least one biconcave lens having a first surface with strongest negative refractive power surface relative to second surface of said biconcave lens; and
   b) said biconcave lens is arranged with said first surface facing said concave mirror.

7. A catadioptric reduction optical system according to claim 2, wherein:
   a) said second optical system includes at least one biconcave lens having a first surface with strongest negative refractive power surface relative to second surface of said biconcave lens; and
   b) said biconcave lens is arranged with said first surface facing said concave mirror.

8. A catadioptric reduction optical system according to claim 3, wherein:
   a) said second optical system includes at least one biconcave lens having a first surface with strongest negative refractive power surface relative to second surface of said biconcave lens; and
   b) said biconcave lens is arranged with said first surface facing said concave mirror.

9. A catadioptric reduction optical system according to claim 5, wherein:
   a) said second optical system includes at least one biconcave lens having a first surface with strongest negative refractive power surface relative to second surface of said biconcave lens; and
   b) said biconcave lens is arranged with said first surface facing said concave mirror.

10. A catadioptric reduction optical system according to claim 1, wherein:
    a) said beam splitter is a polarizing beam splitter; and
    b) the system further includes a quarter-wave plate disposed imagewise of said polarizing beam splitter.

11. A catadioptic reduction optical system according to claim 1, wherein said beam splitter is a rectangular parallelepiped.

* * * * *